(12) United States Patent
Wada et al.

(10) Patent No.: US 7,411,674 B2
(45) Date of Patent: Aug. 12, 2008

(54) POLARIZING MONOCHROMATOR

(75) Inventors: Akio Wada, Hachioji (JP); Katsuji Hasegawa, Hachioji (JP); Hisashi Masago, Hachioji (JP); Takahiko Takenouchi, Hachioji (JP); Masayuki Watanabe, Hachioji (JP); Yoshiro Kondo, Hachioji (JP); Tomoyuki Fukazawa, Hachioji (JP)

(73) Assignee: JASCO Corporation, Hachioji-shi, Tokyo (JP)

( * ) Notice: Subject to any disclaimer, the term of this patent is extended or adjusted under 35 U.S.C. 154(b) by 0 days.

(21) Appl. No.: 11/843,285

(22) Filed: Aug. 22, 2007

(65) Prior Publication Data
US 2008/0049322 A1    Feb. 28, 2008

(30) Foreign Application Priority Data
Aug. 28, 2006    (JP)    .............................. 2006-230143

(51) Int. Cl.
*G01J 3/28* (2006.01)
(52) U.S. Cl. ....................................... 356/327; 356/332
(58) Field of Classification Search ................. 356/332, 356/327, 365; 359/496, 438, 831–837, 485–488, 359/494, 495, 500
See application file for complete search history.

(56) References Cited

U.S. PATENT DOCUMENTS 6,456,434 B1 *    9/2002    Davydov .................... 359/496

FOREIGN PATENT DOCUMENTS

DE    2137422    2/1973

OTHER PUBLICATIONS

Beckman Spectroscopy instrument shown on Wooster College website (undated), one page.

Verpoorte et al., "Nitration and Iodination of Human Carbonic Anhydrases," The Journal of Biological Chemistry, vol. 243, No. 22, 1968, pp. 5993-6000.

(Continued)

*Primary Examiner*—Gregory J. Toatley, Jr.
*Assistant Examiner*—Abdullahi Nur
(74) *Attorney, Agent, or Firm*—Rankin, Hill & Clark LLP

(57) ABSTRACT

A polarizing monochromator comprising a uniaxial birefringent crystal prism, the prism has the geometry of a triangular block having a triangular base, a face including a side of the hypotenuse is an input-output face, where light enters and exits, and a face including the longer side of the right angle is a reflection face, the optic axis of the prism is perpendicular to the base of the prism, the angle of the input-output face of the prism with respect to light coming from a collimator optical system is determined in such a manner that ordinary light and extraordinary light exit from the input-output face of the prism in opposite directions with respect to an optical axis connecting the collimator optical system and the prism, and a light-collecting optical system is disposed to collect either extraordinary light or ordinary light exiting from the input-output face of the prism.

8 Claims, 4 Drawing Sheets

OTHER PUBLICATIONS

Schooley et al., "Magnetic Circular Dichroism Studies, II. Preliminary Results With Some Aromatic Compounds," Department of Chemistry, Stanford University, Sep. 19, 1996, pp. 1377-1382.

Japanese Patent Abstract Publication No. 56-025707 published Mar. 12, 1981, one page.

Simon et al., "Minimum deviation for uniaxial prisms," Applied Optics, Feb. 1, 1995, vol. 34, No. 4, pp. 709-715.

Tewari et al., "Modified polarizing prism," Optics & Laser Technology, vol. 30, No. 1, Feb. 1998, pp. 63-70.

European Search Report for EP 07114668, dated Dec. 13, 2007, eight pages.

* cited by examiner

POLARIZING MONOCHROMATOR

RELATED APPLICATIONS

This application claims priority to the Japanese Application 2006-230143 dated on Aug. 28, 2006 and hereby incorporated with reference for all purposes.

BACKGROUND OF THE INVENTION

1. Field of the Invention

The present invention relates to polarizing monochromator for selecting linearly polarized light having a certain wavelength range, and more specifically, to an improvement of a stray-light rejection system thereof.

2. Prior Art

With the increase in the degree of semiconductor integration, the wavelength of light sources used in optical lithography has been shortened to the vacuum ultraviolet range, as a means for improving resolution. As the popularity of polarized illumination using s-polarization to increase the degree of contrast and exposure to polarized light sources increases, polarizing monochromator for producing monochromatic, linearly polarized light with a high throughput down to the vacuum ultraviolet range have become indispensable for analysis of materials.

A general configuration used to produce monochromatic, linearly polarized light lets light output from a general monochromator pass through a polarizer. This type of configuration, however, would result in a loss due to the throughput of the polarizer. In order to avoid such a loss and stray light, a monochromator based on a double monochromator design has been used. One monochromator performs wavelength dispersion, and the other monochromator performs the functions of a wavelength dispersion element and a polarizer. This polarizing monochromator provides monochromatic, linearly polarized light by using a crystal prism functioning as a wavelength dispersion element and a polarizer simultaneously. In other words, linearly polarized light can be obtained through separation of ordinary light and extraordinary light by double refraction in the crystal prism.

The crystal prism used as the wavelength dispersion element has much higher wavelength dispersion on shorter wavelength side. Accordingly, the slit width can be widened, which results in increased optical throughput and provides measurement data with an improved signal-to-noise ratio.

However, because of the small separation angle between ordinary light and extraordinary light, the polarizing monochromator described above cannot sufficiently eliminate one linearly polarized light component working as a stray light component. For instance, the slit width cannot be widened at longer wavelengths because of small dispersion. If the slit width is widened at the expense of wavelength resolution, stray light would get in. A slit width widened for short-wavelength light would also cause stray light to get in.

SUMMARY OF THE INVENTION

In view of the problems described above, it is an object of the present invention to provide a polarizing monochromator for extracting linearly polarized light of a targeted wavelength range with a high stray-light rejection ratio.

A polarizing monochromator provided to achieve the foregoing object according to the present invention includes a uniaxial birefringent crystal prism, a collimator optical system for collimating light entering the prism and a light-collecting optical system for collecting light exiting from the prism.

The prism has the geometry of a triangular block having a triangular base, a face including a side of the hypotenuse is an input-output face, where light enters and exits, and a face including a longer side of the right angle is a reflection face.

The optic axis of the prism is perpendicular to the base of the prism.

The angle of the input-output face of the prism with respect to light coming from the collimator optical system is determined in such a manner that ordinary light and extraordinary light exit from the input-output face of the prism in opposite directions with respect to the incident light.

The light-collecting optical system is disposed to collect either extraordinary light or ordinary light exiting from the input-output face of the prism.

In the polarizing monochromator according to the present invention, it is preferable that the angle of the input-output face of the prism with respect to light entering from the collimator optical system is specified to satisfy $$n-\sin\alpha < \sin\theta < n+\sin\alpha$$

where $n-$ is a smaller refractive index and $n+$ is a greater refractive index, of the refractive indices for ordinary light and extraordinary light having a predetermined wavelength separated by the prism; $\alpha$ is an angle between the reflection face and the input-output face of the prism; and $\theta$ is an angle of incidence at the input-output face of the prism.

In the polarizing monochromator according to the present invention, it is preferable that the prism is a negative birefringent crystal prism and the light-collecting optical system collects ordinary light exiting from the prism.

The polarizing monochromator according to the present invention is further preferred to include a prism driver. The prism driver adjusts the angle of the input-output face of the prism with respect to light coming from the collimator optical system.

In a polarizing monochromator according to the present invention, a prism has the geometry of a triangular block having a triangular base; a face including a side of the hypotenuse is an input-output face, where light enters and exits; a face including a longer side of the right angle is a reflection face; the optic axis of the prism is perpendicular to the base of the prism; and the relative positions of a collimator optical system and the prism and the angle of the input-output face of the prism are determined in such a manner that ordinary light and extraordinary light exit from the input-output face of the prism in opposite directions with respect to the incident light on the prism. Accordingly, the polarizing monochromator of the present invention can efficiently eliminate one linearly polarized light component working as a stray light.

DESCRIPTION OF THE PREFERRED EMBODIMENTS

A preferred embodiment of the present invention will be described below with reference to the drawings.

Figure 1:
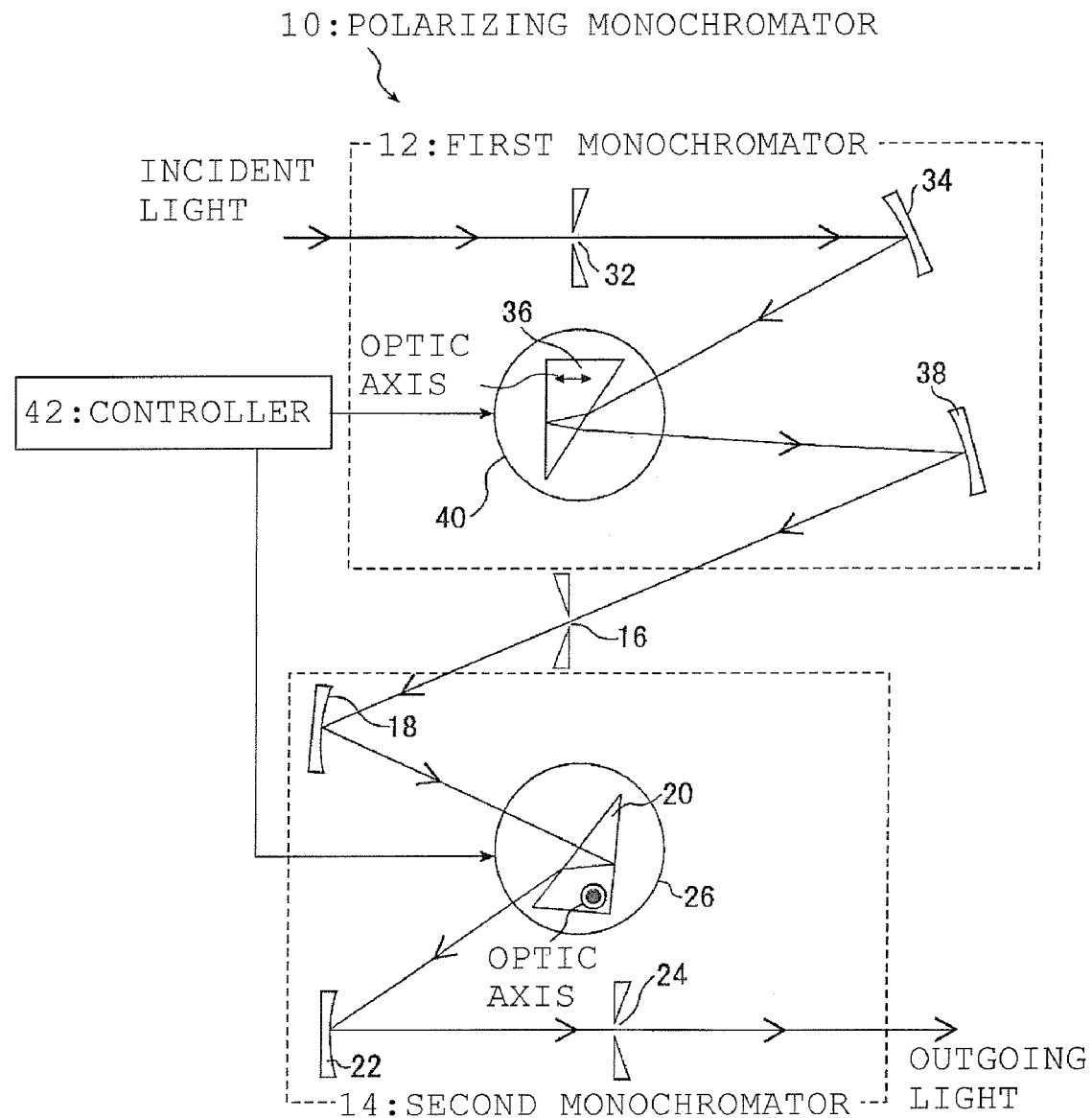
FIG. 1 is an outline diagram of a polarizing monochromator according to an embodiment of the present invention.

FIG. 1 is an outline diagram of a polarizing monochromator 10 according to the embodiment of the present invention. Although the embodiment will be described by taking a polarizing monochromator based on a double monochromator design as an example, a different design can be used.

The polarizing monochromator 10 includes a first monochromator 12 and a second monochromator 14. The first monochromator 12 performs wavelength selection. The second monochromator 14 performs wavelength selection and also selects linearly polarized light in a predetermined direction. Light to be dispersed enters the first monochromator 12, and wavelength-selected light exits from the first monochromator 12. The light of wavelength other than a targeted one dispersed by the prism 36 of the first monochromator 12 is blocked by an intermediate slit 16. Light having the targeted wavelength passes through the intermediate slit 16 and enters the second monochromator 14.

The second monochromator 14 includes a collimator optical system (collimator mirror) 18, a uniaxial birefringent crystal prism 20, a light-collecting optical system (collector mirror) 22, an exit slit 24, and a driver 26. The optic axis of the birefringent crystal prism 20 is perpendicular to the plane of incidence of incoming light (perpendicular to the plane of FIG. 1). Since the linearly polarized light component (ordinary light) perpendicular to the optic axis and the linearly polarized light component (extraordinary light) parallel to the optic axis experience different refractive indices, the outputs of the birefringent crystal prism 20 are provided in different directions depending on the direction of polarization.

Light entering the second monochromater 14 through the intermediate slit 16 is collimated by the collimator mirror 18 and enters the birefringent crystal prism 20. Light entering the birefringent crystal prism 20 is output in different directions depending on the wavelength and the direction of polarization. Light output from the birefringent crystal prism 20 is collected by the collector mirror 22 and sent to the exit slit 24. The exit slit 24 blocks light other than the targeted light output in a specific direction from the birefringent crystal prism 20 and passes the targeted light having a specific wavelength range and a specific direction of polarization.

Figure 2:
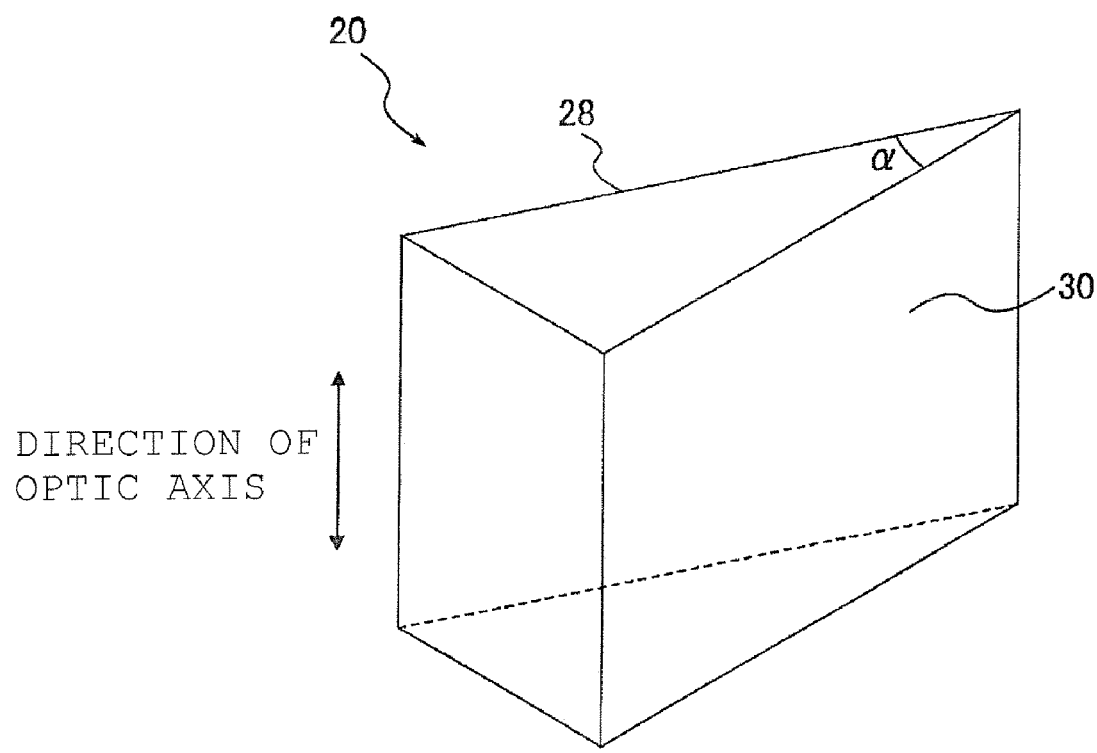
FIG. 2 is a perspective view of a birefringent crystal prism used in the polarizing monochromator according to the embodiment of the present invention.

The uniaxial birefringent crystal prism 20 used in this embodiment is a negative birefringent prism in which the refractive index for ordinary light is greater than the refractive index for extraordinary light. As shown in FIG. 2, the birefringent crystal prism used here has the geometry of a triangular block having a triangular base. One face including a side of the hypotenuse is an input-output face 28, where light enters and exits. Another face including a longer side of the right angle is a reflection face 30. The optic axis of the birefringent crystal prism 20 is perpendicular to the base, and the optic axis is perpendicular to the plane of incidence of light.

The driver 26 adjusts the angle of the input-output face 28 (see FIG. 2) of the birefringent crystal prism 20 with respect to light coming from the collimator mirror 18. The angle of the input-output face 28 of the birefringent crystal prism 20 adjusted by the driver 26 determines the wavelength range of light directed to the exit slit 24.

The relative positions of the collimator mirror 18 and the birefringent crystal prism 20 and the angle of the input-output face 28 of the birefringent crystal prism 20 are determined in such a manner that ordinary light and extraordinary light exit from the input-output face 28 of the birefringent crystal prism 20 in opposite directions with respect to the incident light, as will be described below in detail. To be more specific, it is preferred that the angle of the input-output face 28 of the prism 20 be adjusted to satisfy the following expression with respect to light coming from the collimator mirror 18:

$$n-\sin\alpha < \sin\theta < n+\sin\alpha$$

where n− is a smaller refractive index and n+ is a greater refractive index, of the refractive indices for extraordinary light and ordinary light having a specific wavelength dispersed by the prism; α is an angle between the reflection face 30 and the input-output face 28 of the birefringent crystal prism 20; and θ is an angle of incidence, at the input-output face 28 of the birefringent crystal prism 20, of light coming from the collimator mirror 18.

The structure described above causes ordinary light exiting from the birefringent crystal prism 20 to be collected by the collector mirror 22. Extraordinary light (stray light component) output from the birefringent crystal prism 20 travels toward the collimator mirror 18 or toward a position above the collimator mirror 18 in the FIG. 4A.

As shown in FIG. 1, the first monochromator 12 includes an entrance slit 32, a collimator optical system (collimator mirror) 34, a prism 36, a light-collecting optical system (collector mirror) 38, and a driver 40. Light to be dispersed passes through the entrance slit 32 in the first monochromator 12. Light passing through the entrance slit 32 is collimated by the collimator mirror 34 and enters the prism 36. Light entering the prism 36 is output in different directions depending on the wavelengths. Light output from the prism 36 is collected by the collector mirror 38 and sent to the intermediate slit 16. The intermediate slit 16 blocks light other than light output in a specific direction from the prism 36 and passes light having a wavelength in a specific range. The driver 40 adjusts the orientation of the prism 36 with respect to the input light so that light in the specific wavelength range passes through the intermediate slit 16.

The prism 36 of the first monochromator 12 is also similar to that shown in FIG. 2, but the optic axis thereof is perpendicular to the reflection face of the prism. In other words, the optic axis of the prism 36 is almost parallel to the optical path of light passing through the prism 36, and ordinary light and extraordinary light experience the same refractive index. Therefore, the first monochromator 12 performs just wavelength selection.

The driver 40 of the first monochromator 12 and the driver 26 of the second monochromater 14 include a wavelength-scanning (wavelength-shift) cam and the like. The drivers 26 and 40 are controlled by a controller 42. In the present embodiment, both the prism 36 of the first monochromator 12 and the birefringent crystal prism 20 of the second monochromater 14 perform wavelength selection by using dispersion in the refractive index of ordinary light, so that the driver 40 of the first monochromator 12 and the driver 26 of the second monochromater 14 can use identical wavelength-scanning cam.

The present embodiment has the general structure as described above, and the operation will be described below.

Figure 3:
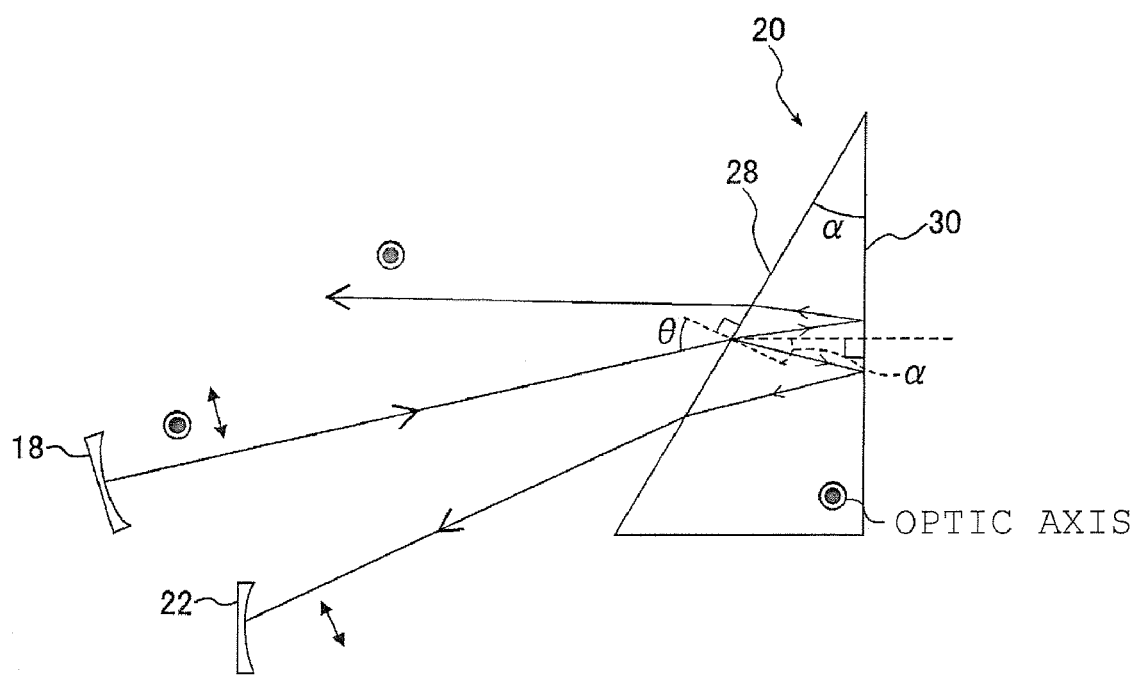
FIG. 3 is a diagram illustrating a part of the polarizing monochromator according to the embodiment of the present invention.

FIG. 3 is a diagram illustrating the function of the birefringent crystal prism 20 of the second monochromator 14. Since the first monochromator 12 performs optical wavelength selection alone and does not perform polarization selection, light entering the birefringent crystal prism 20 of the second monochromator 14 is a combination of mutually-orthogonal linearly polarized light components having a specific wavelength λ (in the figure, a linearly polarized light component perpendicular to the plane of the drawing is indicated by a double circle, and a linearly polarized light component parallel to the plane of the drawing is indicated by a double-headed arrow).

Light coming from the collimator mirror 18 enters the input-output face 28 of the birefringent crystal prism 20 at a predetermined incident angle θ. The optic axis of the birefringent crystal prism 20 is perpendicular to the plane of incidence of light (perpendicular to the plane of the drawing, indicated by a double circle). Therefore, the linearly polarized light component (extraordinary light) parallel to the optic axis and the linearly polarized light component (ordinary light) perpendicular to the optic axis experience different refractive indices. Since a negative birefringent crystal prism is used here, the refractive index for ordinary light is greater than the refractive index for extraordinary light.

Light entering the input-output face 28 of the birefringent crystal prism 20 travels in the prism 20 at refraction angles depending on the directions of polarization. If the refraction angle is greater than the angle α between the reflection face 30 and the input-output face 28, light reflected by the reflection face 30 exits from the input-output face 28 in an upward direction compared with the incident light in the FIG. 3. If the refraction angle is smaller than the angle u., the output light exits from the input-output face 28 in a downward direction compared with the incident light in the FIG. 3. Through the use of these properties, in the polarizing monochromator of the present embodiment, the angle of the input-output face 28 of the birefringent crystal prism 20 with respect to light entering from the collimator mirror 18 is determined to satisfy the following expression:

$$n - \sin \alpha < \sin \theta < n + \sin \alpha$$

where n− is a smaller refractive index (refractive index for extraordinary light) and n+ is a greater refractive index (refractive index for ordinary light), of the refractive indices of ordinary light and extraordinary light.

In the structure described above, the collector mirror 22 disposed below the collimator mirror 18 in the FIG. 4A receives the ordinary light component alone. Accordingly, just the ordinary light component travels toward the exit slit 24. The polarizing monochromator of the present embodiment outputs the desired linearly polarized light component (ordinary light) and the stray light component (extraordinary light) in opposite directions with respect to light entering the birefringent crystal prism 20, so that the stray light component can be eliminated efficiently.

Figure 4A:
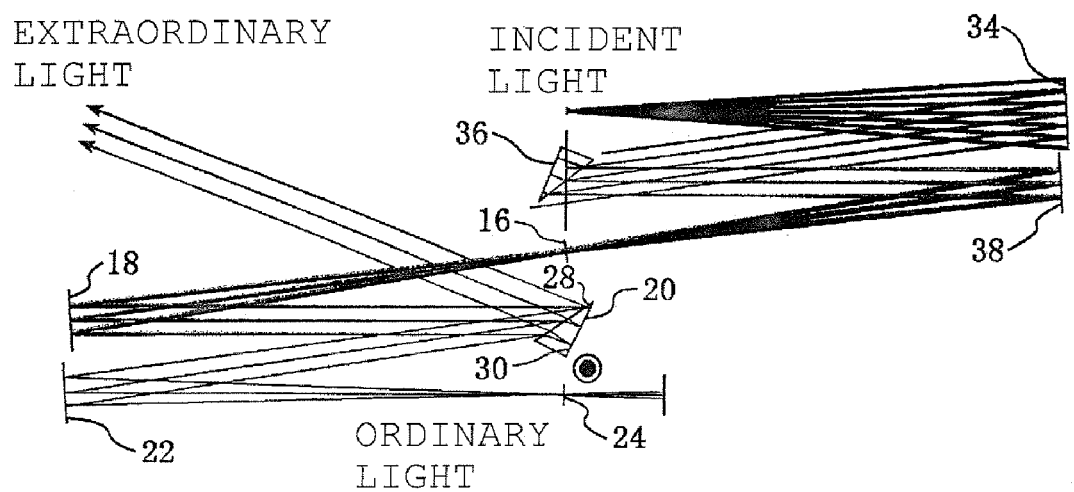
FIG. 4A is a diagram illustrating the optical paths of extraordinary light and ordinary light when the birefringent crystal prism of the embodiment of the present invention is used.
Figure 4B:
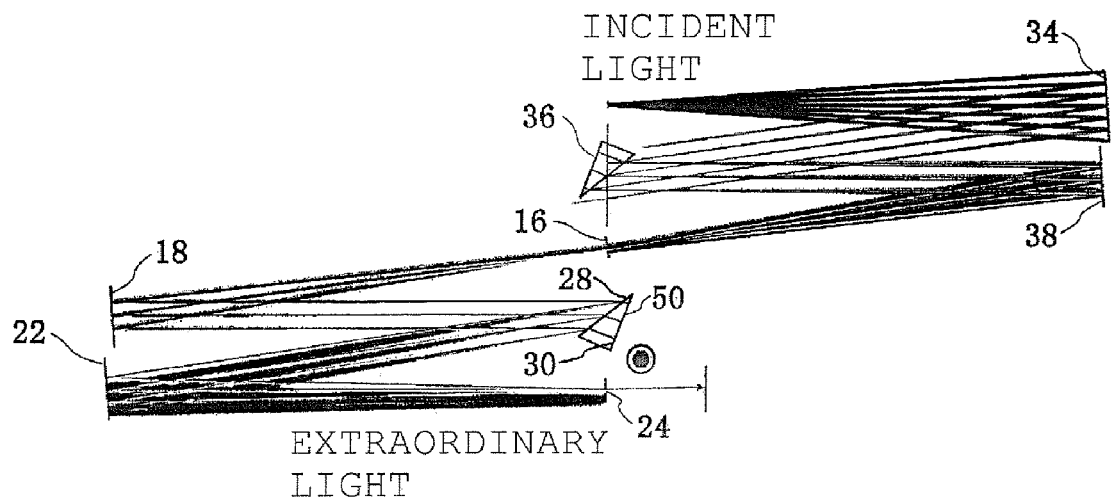
FIG. 4B is a diagram illustrating the optical path of extraordinary light when a conventional crystal prism is used.

FIGS. 4A and 4B are diagrams showing optical paths obtained when the birefringent crystal prism 20 of the present embodiment and a conventional crystal prism 50 are used, respectively, for comparison.

FIG. 4A shows that extraordinary light exiting from the input-output face 28 of the birefringent crystal prism 20 of the present embodiment travels not toward the exit slit 24 but in an upward direction with respect to the output light in the FIG. 4A. FIG. 4B shows that extraordinary light exiting from the input-output face 28 of the conventional crystal prism 50 travels toward the exit slit 24 in a downward direction with respect to the output light in the figure.

As has been described above, according to the polarizing monochromator of the present embodiment, extraordinary light exits from the input-output face 28 of the birefringent crystal prism 20 in an upward direction with respect to the incident light as depicted in FIG. 4A. While ordinary light exits from the input-output face 28 of the birefringent crystal prism 20 in a downward direction with respect to the incident light in the figure and travels toward the exit slit 24. Therefore, the polarizing monochromator of the present embodiment can eliminate extraordinary light efficiently.

What is claimed is:

1. A polarizing monochromator for selecting monochromatic, linearly polarized light, comprising:
   a uniaxial birefringent crystal prism;
   a collimator optical system for collimating light entering the prism; and
   a light-collecting optical system for collecting light exiting from the prism;
   wherein the prism has the geometry of a triangular block having a triangular base, a face including a side of the hypotenuse is an input-output face, where light enters and exits, and a face including a longer side of the right angle is a reflection face;
   the optic axis of the prism is perpendicular to the base of the prism;
   the angle of the input-output face of the prism with respect to light coming from the collimator optical system is determined in such a manner that ordinary light and extraordinary light exit from the input-output face of the prism in opposite directions with respect to an optical axis connecting the collimator optical system and the prism; and
   the light-collecting optical system is disposed to collect either extraordinary light or ordinary light exiting from the input-output face of the prism.

2. A polarizing monochromator according to claim 1, wherein the angle of the input-output face of the prism with respect to light entering from the collimator optical system is specified to satisfy $$n - \sin \alpha < \sin \theta < n + \sin \alpha$$

where n− is a smaller refractive index and n+ is a greater refractive index, of the refractive indices for ordinary light and extraordinary light having a predetermined wavelength dispersed by the prism; α is an angle between the reflection face and the input-output face of the prism; and θ is an angle of incidence, at the input-output face of the prism, of light coming from the collimator optical system.

3. A polarizing monochromator according to claim 1, wherein the prism is a negative birefringent crystal prism; and the light-collecting optical system collects ordinary light exiting from the prism.

4. A polarizing monochromator according to claim 2, wherein the prism is a negative birefringent crystal prism; and the light-collecting optical system collects ordinary light exiting from the prism.

5. A polarizing monochromator according to claim 1, further comprising a prism driver for adjusting the angle of the input-output face of the prism with respect to light coming from the collimator optical system.

6. A polarizing monochromator according to claim 2, further comprising a prism driver for adjusting the angle of the input-output face of the prism with respect to light coming from the collimator optical system.

7. A polarizing monochromator according to claim 3, further comprising a prism driver for adjusting the angle of the input-output face of the prism with respect to light coming from the collimator optical system.

8. A polarizing monochromator according to claim 4, further comprising a prism driver for adjusting the angle of the input-output face of the prism wit respect to light coming from the collimator optical system.

* * * * *